(12) United States Patent
Teshiba et al.

(10) Patent No.: US 10,679,888 B2
(45) Date of Patent: ***Jun. 9, 2020

(54) FOUNDRY-AGNOSTIC POST-PROCESSING METHOD FOR A WAFER

(71) Applicant: RAYTHEON COMPANY, Waltham, MA (US)

(72) Inventors: Mary A. Teshiba, Torrance, CA (US); John J. Drab, Santa Barbara, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/403,317

(22) Filed: May 3, 2019

(65) Prior Publication Data

US 2019/0259653 A1 Aug. 22, 2019

Related U.S. Application Data

(62) Division of application No. 15/166,821, filed on May 27, 2016, now Pat. No. 10,354,910.

(51) Int. Cl.
*H01L 21/762* (2006.01)
*H01L 21/20* (2006.01)

(52) U.S. Cl.
CPC .... *H01L 21/76251* (2013.01); *H01L 21/2007* (2013.01)

(58) Field of Classification Search
CPC ............ H01L 21/76251; H01L 21/2007
See application file for complete search history.

(56) References Cited

U.S. PATENT DOCUMENTS

| | | | |
|---|---|---|---|
| 5,110,748 A | 5/1992 | Sarma | |
| 5,455,202 A | 10/1995 | Malloy et al. | |
| 6,127,244 A | 10/2000 | Lee | |
| 7,238,622 B2 | 7/2007 | Atwater, Jr. et al. | |
| 7,262,622 B2 | 8/2007 | Zhao | |
| 7,528,463 B2 | 5/2009 | Forbes | |
| 2003/0209776 A1 | 11/2003 | Desko et al. | |
| 2007/0207592 A1 | 9/2007 | Lu et al. | |
| 2007/0284729 A1 | 12/2007 | Kwon et al. | |
| 2010/0032795 A1 | 2/2010 | Aitken et al. | |

(Continued)

FOREIGN PATENT DOCUMENTS

| | | |
|---|---|---|
| EP | 1453086 A2 | 9/2004 |
| JP | S62122142 A | 6/1987 |

(Continued)

OTHER PUBLICATIONS

Benaissa et al., "RF CMOS on High-Resistivity Substrates for System-on-Chip Applications", IEEE Transactions on Electron Devices, vol. 50, No. 3, Mar. 2003, pp. 567-576.
Chang et al., "Buried Oxide Thickness Effect and Lateral Scaling of SiGe HBT on SOI Substrate", Semiconductor Device Research Symposium, 2003 International, pp. 16-17.
ISR/WO, Issued Aug. 25, 2017, RAY0338PCT, PCT Application No. PCT/US2017/033330, 12 pages.

(Continued)

*Primary Examiner* — Dale E Page
*Assistant Examiner* — Quovaunda Jefferson
(74) *Attorney, Agent, or Firm* — Cantor Colburn LLP

(57) ABSTRACT

A foundry-agnostic post-processing method for a wafer is provided. The wafer includes an active surface, a substrate and an intermediate layer interposed between the active surface and the substrate. The method includes removing the wafer from an output yield of a wafer processing foundry, thinning the substrate to the intermediate layer or within microns of the intermediate layer to expose a new surface and bonding the new surface to an alternate material substrate which provides for enhanced device performance as compared to the substrate.

7 Claims, 4 Drawing Sheets

(56) References Cited

U.S. PATENT DOCUMENTS

2013/0037922 A1  2/2013  Arriagada et al.
2015/0371905 A1  12/2015 Carroll et al.
2016/0126150 A1  5/2016  Goldberg

FOREIGN PATENT DOCUMENTS

| JP | H1126733 A | 1/1999 |
| JP | 2004282063 A | 10/2004 |
| JP | 2006245370 A | 9/2006 |
| JP | 2011049384 A | 3/2011 |
| JP | 2013543276 A | 11/2013 |

OTHER PUBLICATIONS

J. Comeau et al., "Proton Tolerance of Advanced SiGe HBTs Fabricated on Different Substrate Materials", IEEE Trans on Nuclear Science, vol. 51 2004, pp. 3743-3747.
Joseph et al., "A High-Resistivity SiGe BiCMOS Technology for WiFi RF Front-End-IC Solutions", IEEE Bipolar/BiCMOS Circuits and Technology Meeting (BCTM), 2013, pp. 231-234.
Martorell et al., "Modeling and Evaluation of Substrate Noise Induced by Interconnects", Proceedings of the Design, Automation and Test in Europe Conference and Exhibition, 2013, 6 pages.
Reyes et al., "High Resistivity Si as a Microwave Substrate", Electronic Components and Technology Conference, 1996. Proceedings., 46th, pp. 382-391.
Thibeault et al., "A Study of Ultra-High Performance SiGe HBT Devices on SOI", 2013 IEEE Bipolar/BiCMOS Circuits and Technology Meeting (BCTM), pp. 235-238.
OA issued Oct. 23, 2019 in RAY0338JP, JP Application No. 2018-561469, 5 pages.
Korean Office Action dated Mar. 11, 2020; Korean Patent Application No. 10-2018-7037485; pp. 17.

FOUNDRY-AGNOSTIC POST-PROCESSING METHOD FOR A WAFER

DOMESTIC PRIORITY

This application is a divisional of U.S. application Ser. No. 15/166,821, titled "FOUNDRY-AGNOSTIC POST-PROCESSING METHOD FOR A WAFER", which was filed May 27, 2016. The entire contents of U.S. application Ser. No. 15/166,821 are incorporated by reference herein.

BACKGROUND

The present disclosure relates to foundry-agnostic post-processing methods for wafers and, more particularly, to foundry-agnostic post-processing methods for wafers where alternative material substrates are bonded to wafers to create customized devices with improved performance.

In electronics, a wafer is a thin slice of semiconductor material that is used for the fabrication of integrated circuits and in photovoltaics. The wafer serves as the substrate for microelectronic devices built in and over the wafer and undergoes many microfabrication process steps such as doping or ion implantation, etching, deposition of various materials and photolithographic patterning. At a final stage, individual microcircuits formed on the wafer may be separated from one another by a dicing process and packaged for shipping.

Wafers are frequently formed of silicon (Si) or silicon germanium (SiGe) and may include low resistivity (LRS) substrates, high resistivity (HRS) substrates and silicon-on-insulator (SOI) substrates with a buried oxide (BOX) layer disposed on an HRS substrate. Over time, it has been demonstrated that the higher resistivity substrates can in some cases improve certain aspects of device performance by reducing parasitic substrate losses, such as collector-substrate capacitance. However, foundries where wafers are typically processed do not have the capacity for providing wafers with substrates that are more resistive than the LRS, HRS and SOT substrates.

SUMMARY

According to one embodiment, a foundry-agnostic post-processing method for a wafer is provided. The wafer includes an active surface, a substrate and an intermediate layer interposed between the active surface and the substrate. The method includes removing the wafer from an output yield of a wafer processing foundry, thinning the substrate to the intermediate layer or within microns of the intermediate layer to expose a new surface and bonding the new surface to an alternate material substrate which provides for enhanced device performance as compared to the substrate.

According to another embodiment, a foundry-agnostic post-processing method for a wafer is provided. The wafer includes an active surface, a silicon handle and a buried oxide (BOX) layer interposed between the active surface and the silicon handle. The method includes removing the wafer from an output yield of a wafer processing foundry, thinning the silicon handle to the BOX layer or within microns of the BOX layer to expose a new surface and bonding the new surface to an alternate material substrate which provides for enhanced device performance as compared to the silicon handle.

According to yet another embodiment, a foundry-agnostic post-processing method for a wafer is provided. The wafer includes an active surface, a high resistivity substrate (HIRES SX) and a near sub-collector (NS) interposed between the active surface and the HRES SX. The method includes removing the wafer from an output yield of a wafer processing foundry, thinning the HRES SX to the NS or within microns of the NS to expose a new surface and bonding the new surface to an alternate material substrate which provides for enhanced device performance as compared to the HRES SX.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be described below, post-process oxide wafer bonding of high resistivity materials can achieve and/or enhance device performance by replacing foundry substrate material with a higher resistivity substrate, such as glass or fused silica. The wafer bonding post-processing is foundry-agnostic where device parameters are altered resulting in custom, in-house devices/models.

Figure 1:
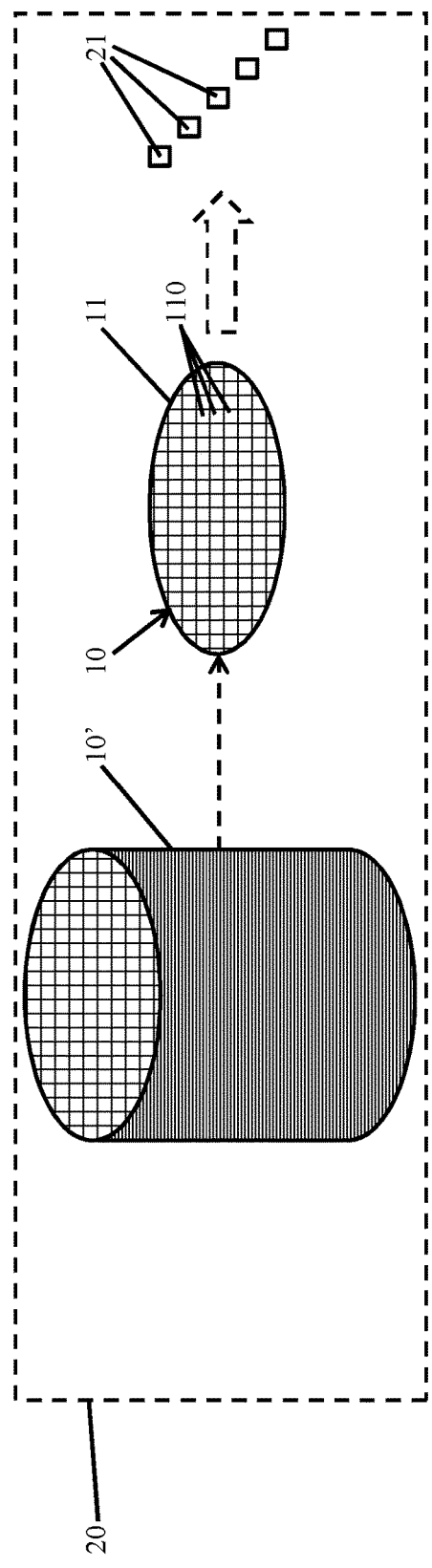
FIG. 1 is a schematic illustration of wafer removal from an output yield of a wafer processing foundry.
Figure 2:
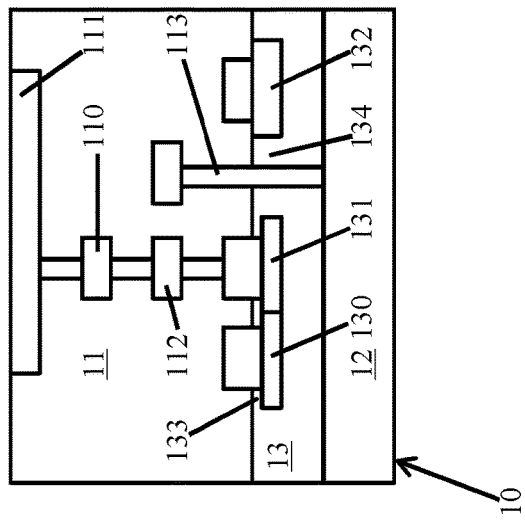
FIG. 2 is an enlarged side view of an SOI wafer in accordance with embodiments.

With reference to FIGS. 1 and 2-4, a foundry-agnostic post-processing method is provided for use with a wafer 10. As shown in FIG. 2, the wafer 10 may include an active surface 11 on which electronic components 110 are operably disposed within a dielectric-, resin- or epoxy-based matrix, a silicon handle 12 that is made of silicon (Si) or silicon Germanium (SiGe) and a buried oxide (BOX) layer 13. The BOX layer 13 is interposed between the active surface 11 and the silicon handle 12 such that the wafer 10 as a whole has a silicon-on-insulator (SOI) configuration.

The electronic components 110 may include stacked layers of metallization (e.g., metallization layers 1-6) or semi-conductors such as silicon (Si) or silicon germanium (SiGe) and vias that are configured to form bond pads 111 at bond pad openings, capacitors 112 and isolated deep silicon vias 113. The BOX layer 13 may include N-wells 130, P-wells 131 and isolated P-substrate regions 132 and may be formed to define shallow trench isolation regions 133 as well as deep trench isolation regions 134 between adjacent N-wells 130 and P-wells 131. The isolated deep silicon vias 113 may be extendible into and through the deep trench isolation regions 134.

The wafer 10 may be formed and assembled within a wafer processing foundry 20 (see FIG. 1) as part of a yield 10' of wafers 10. Each wafer 10 may be provided with enough electronic components 110 to be divisible into multiple individual devices 21 through a dicing process. In any case, as part of the method, one or more of the wafers 10 is removed from the output yield 10' of the wafer processing foundry 20, as shown in FIG. 1, for further foundry-agnostic post-processing.

Figure 4:
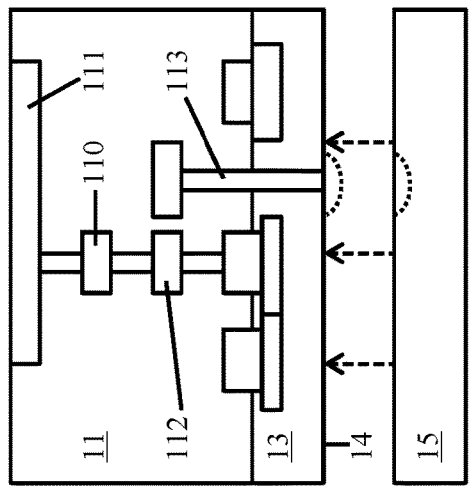
FIG. 4 is an enlarged side view of an SOI wafer with a fused silica substrate.
Figure 3:
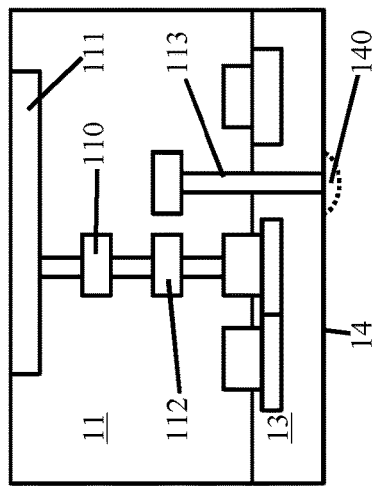
FIG. 3 is an enlarged side view of the SOI wafer of FIG. 2 with its silicon handle removed.

As shown in FIGS. 2-4, the foundry-agnostic post-processing includes a thinning of the silicon handle 12 to the BOX layer 13 or to within microns of the BOX layer 13 to thereby expose a new surface 14 and a bonding of the new surface 14 to an alternate material substrate 15. This alternate material substrate 15 is formed of a material that has a greater characteristic resistivity than the material of the silicon handle 12 and thus provides the multiple individual devices 21 (shown in FIG. 1) of the wafer 10 with enhanced device performance capabilities as compared to what was previously possible with the silicon handle 12 being intact. In accordance with embodiments, the alternate material substrate 15 may be formed of glass or fused silica and the bonding may be achieved by way of oxide bonding processing for example.

In accordance with further embodiments, the thinning may include an initial stage of grinding of outer layers of the silicon handle 12, a halting of the grinding process so as to avoid grinding the BOX layer 13 or the isolated deep silicon vias 113, and a subsequent chemical mechanical polishing (CMP) of inner layers of the silicon handle 12. In this way, a lower-most surface of the BOX layer 13 may be exposed as the new surface 14, or a very, very thin layer of the original silicon handle 12 (having a thickness on the order of 1-100 µm) may be exposed as the new surface 14. In any case, once the alternate material substrate 15 is bonded to the new surface 14, device performance is improved or enhanced due to the increased resistivity of the alternate material substrate 15 as compared to the original silicon handle 12.

In accordance with embodiments, the improvements in device performance achieved by movement to higher resistivity substrates may relate to decreased attenuation angles for a given device at a given signal frequency, noise isolation increases, substantial quality factor increases and increased capacitance potential. These improvements would be consistent with what has been observed in recent studies that demonstrate that high resistivity substrates improve device performance as compared to low or medium resistance substrates by reducing parasitic substrate losses, such as collector-substrate capacitance, along with other effects.

For example, increased substrate resistivity is associated with substantial decreases in an attenuation coefficient as signal frequency increases. In particular, for a given implementation of a waveguide for low-loss transmission lines, it has been seen that an attenuation coefficient for a low resistivity substrate ($\rho_{sub}$<5.0 ohm-cm) increases substantially as compared to an attenuation coefficient for a medium resistivity substrate (20 ohm-cm<$\rho_{sub}$<60 ohm-cm) and an attenuation coefficient for a high resistivity substrate ($\rho_{sub}$>1000 ohm-cm) as signal frequencies approach and then exceed 2 GHz. In a test structure for noise isolation, noise isolation as a function of frequency decreases with increased substrate resistivity. That is, for a given test structure with a constant spacing and active (moat) size, isolation improves substantially with the use of medium- or high-resistivity substrates for signals ranging from 0 GHz to 12 (or more) GHz. Moreover, at lower frequencies (from 0 GHz to 3.5 GHz), the use of high-resistivity substrates leads to an even greater isolation advantage than medium-resistivity substrates. For a 2.0-pF MIM capacitor, a quality factor as a function of frequency is substantially improved for increased substrate resistivity. Such increase is especially evident for signal frequencies less than 7 GHz where the quality factor of the medium-resistivity substrate is more than twice that of the low-resistivity substrate and the quality factor of the high-resistivity substrate is substantially higher than that of the medium-resistivity substrate (e.g., at about 2 GHz, the quality factor, Q, for the low-resistivity substrate is ~35, Q for the medium-resistivity substrate is ~90 and Q for the high-resistivity substrate is ~140). Also, the use of SOI substrates as opposed to bulk silicon has been seen to result in a reduction in collector to substrate capacitance (Ccs) of 40% due to elimination of the collector to substrate junction capacitance. It is thus expected that any modification of a given device by removal of its silicon handle 12 (or any similar or corresponding feature) and replacement of the removed element with a higher resistivity substitute.

In accordance with still further embodiments, the thinning described above may include a recognition of an existence of one or more of the deep silicon vias 113 in the wafer 10 and an avoidance of at least a portion of the execution of the thinning described above at a location of the deep silicon via 13. In doing so, it is to be understood that the new surface 14 may have an irregular topology 140 prior to the bonding of the alternate material substrate 15. This irregular topology 140 is, however, acceptable in view of the preference for undamaged electrical components and will in any case be absorbed by the alternate material substrate 15, which will not have any irregularities in its outward topology.

Figure 5:
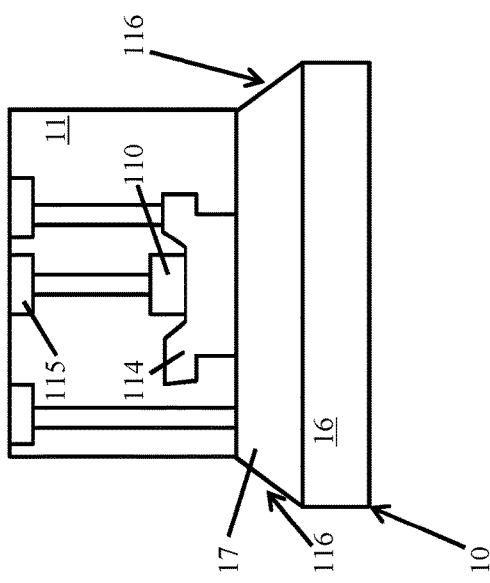
FIG. 5 is an enlarged side view of a wafer with an HRES SX in accordance with embodiments.

With reference to FIGS. 1 and 5-7, a foundry-agnostic post-processing method is provided for use with a wafer 10 having a different structure from what is described above. As shown in FIG. 5, the wafer 10 may include an active surface 11 on which electronic components 110 are operably disposed within a dielectric-, resin- or epoxy-based matrix, a high resistivity substrate (HRES SX) 16 that is made of silicon (Si) or silicon Germanium (SiGe), and near sub-collector (NS) 17. The NS 17 is interposed between the active surface 11 and the HRES SX 16. The electronic components 110 may include gate structures 114 and contacts 115 that are formed over the NS 17, and the NS 17 may be bordered or delimited by trench isolation regions 116. At least one or more of the electronic components 110 and the NS 17 may include silicon (Si) or silicon germanium (SiGe).

The wafer 10 may be formed and assembled within a wafer processing foundry 20 (see FIG. 1) as part of a yield 10' of wafers 10. Each wafer 10 may be provided with enough electronic components 110 to be divisible into multiple individual devices 21 through a dicing process. In any case, as part of the method, one or more of the wafers 10 is removed from the output yield 10' of the wafer processing foundry 20, as shown in FIG. 1, for further foundry-agnostic post-processing.

Figure 7:
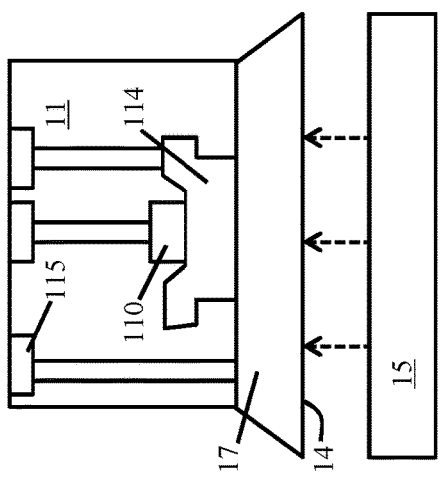
FIG. 7 is an enlarged side view of a wafer with a fused silica substrate.
Figure 6:
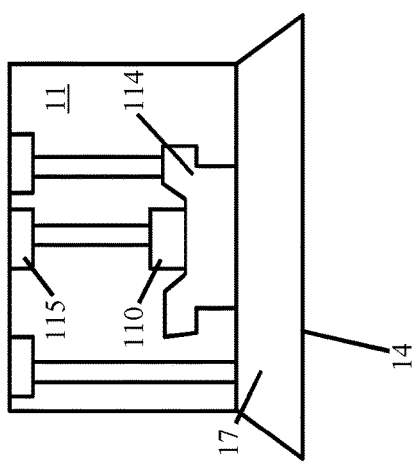
FIG. 6 is an enlarged side view of the wafer of FIG. 5 with its HRES SX removed.

As shown in FIGS. 5-7, the foundry-agnostic post-processing includes a thinning of the HRES SX 16 to the NS 17 or to within microns of the NS 17 to thereby expose a new surface 14 and a bonding of the new surface 14 to an alternate material substrate 15. As above, this alternate material substrate 15 is formed of a material that has a greater characteristic resistivity than the material of the HRES SX 16 and thus provides the multiple individual devices 21 of the wafer 10 with improved or enhanced device performance capabilities as compared to what was previously possible with the HRES SX 16 being intact. In accordance with embodiments, the alternate material substrate 15 may be formed of any type of glass or fused silica as long as the alternate material substrate 15 has a greater resistivity than the HRES SX 16. The bonding may be achieved by way of oxide bonding processing for example.

As above, in accordance with embodiments, the improvements in device performance achieved by movement to higher resistivity substrates may relate to decreased attenuation angles for a given device at a given signal frequency, noise isolation increases, substantial quality factor increases and increased capacitance potential. Again, the improvements would be consistent with what has been observed in recent studies that demonstrate that high resistivity substrates improve device performance as compared to low or medium resistance substrates by reducing parasitic substrate losses, such as collector-substrate capacitance, along with other effects.

In accordance with further embodiments, the thinning may include an initial stage of grinding of outer layers of the FIRES SX 16, a halting of the grinding process so as to avoid grinding the NS 17, and a subsequent chemical mechanical polishing (CMP) of inner layers of the FIRES SX 16. In this way, a lower-most surface of the NS 17 may be exposed as the new surface 14 or a very, very thin layer of the original HRES SX 16 may be exposed as the new surface 14 (having a thickness on the order of 1-100 µm). In any case, once the alternate material substrate 15 is bonded to the new surface 14, device performance is improved due to the increased resistivity of the alternate material substrate 15 as compared to the original FIRES SX 16.

Figure 9:
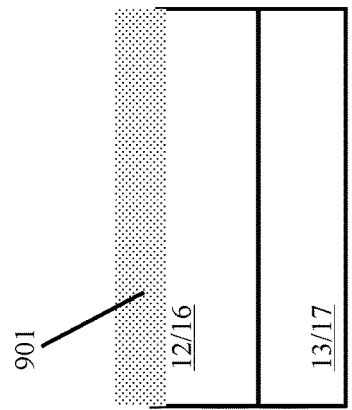
FIG. 9 is a schematic illustration of a chemical mechanical polishing process for the wafer of FIG. 8.
Figure 8:
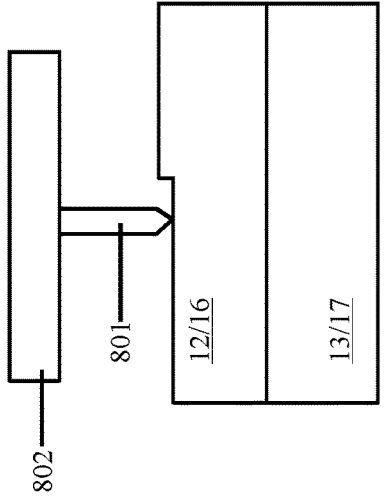
FIG. 8 is a schematic illustration of a grinding process for a wafer.

In accordance with embodiments and, with reference to FIGS. 8 and 9, the grinding of the silicon handle 12 or the HRES SX 16 may be executed by way of a machining element (e.g., a diamond point turning (DPT) machine or another similar machine) and/or by CMP, chemical or dry etching or other similar etching processes.

For those cases in which machining processes are employed, as shown in FIG. 8, a head 801 is positioned and controlled relative to the silicon handle 12/HRES SX 16 by servo elements of a machine 802. The head 801 thus iteratively removes material from the silicon handle 12/HRES SX 16 by movement commanded by the servo elements. Where CMP or chemical etching processes are employed, as shown in FIG. 9, portions of the silicon handle 12/HRES SX 16 that are outside of the region where the thinning is to be executed may be masked and the resulting exposed portion of the silicon handle 12/HRES SX 16 is exposed to an appropriate polish or etchant 901. Dry etching processes may incorporate particles (ions) or gas impingement for interactions with and material removal from the silicon handle 12/HRES SX 16 as well.

Although the machining processes and CMP/etching processes are described above as being employed separately, it is to be understood that they may be employed in combination as well.

Figure 10:
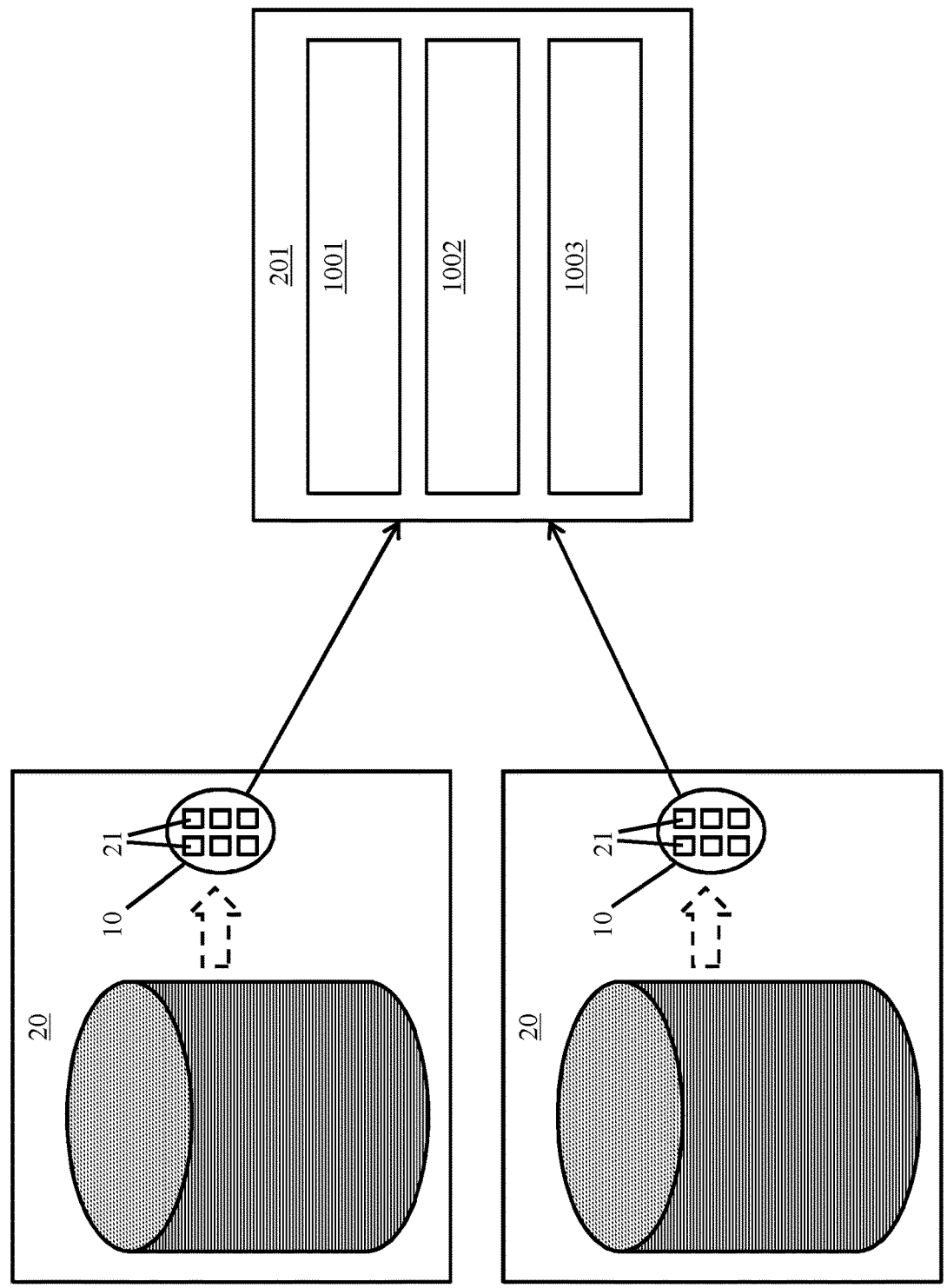
FIG. 10 is a schematic diagram illustrating an additional optimization method for use with similar wafers obtained from a plurality of foundries.

Because the processes described above are foundry-agnostic, the processes enable a user or operator to obtain wafers from a vast supply of yields 10' from a number of different foundries 20. In this way, the user or operator has a large population of wafers to work with and can control multiple variables associated with the processes for observation as to how to optimize the processes for different types of wafers 10. That is, while wafers from various foundries 20 may all be superficially similar to those of FIGS. 2-4, the wafers of one such foundry 20 may still differ from wafers of another foundry 20 in certain ways (e.g., BOX layer thickness, substrate thickness, location of electrical components, etc.). As such, with reference to FIG. 10, the methods discussed above may also include obtaining similar wafers from a plurality of foundries 20 and compiling those similar wafers in a post-processing facility 201, executing one or more of the removing, thinning and bonding operations to each of the similar wafers at the post-processing facility 201 (block 1001), analyzing yields resulting from executions of the one or more of the removing, thinning and bonding operations to each of the similar wafers at the post-processing facility 201 (block 1002) and optimizing, based on results of the analysis, the executions of the one or more of the removing, thinning and bonding operations for each of the similar wafers at the post-processing facility 201 (block 1003).

Thus, while a first wafer 10 from a first one of the foundries 20 might be very similar to a second wafer 10 from a second one of the foundries 20 in that they include the features of FIGS. 2-4 in perhaps similar but not exactly the same dimensions, it may be possible to optimize the bonding operations for each of the first and second wafers 10 at the post-processing facility 201. That is, once the removing, thinning and bonding operations are executed at the post-processing facility 201 at block 1001, subsequent analysis may reveal that the alternate material substrate 15 has a greater device performance enhancing effect on the first wafer 10 than on the second wafer 10 due to say minor dimensional differences between the first and second wafers 10. Based on this analysis, subsequent bonding operations for similar second wafers 10 from the second foundry 20 may be conducted slightly differently either by using a different material for the alternate material substrate 15 or by adjusting a thickness of the alternate material substrate 15.

Figure 12:
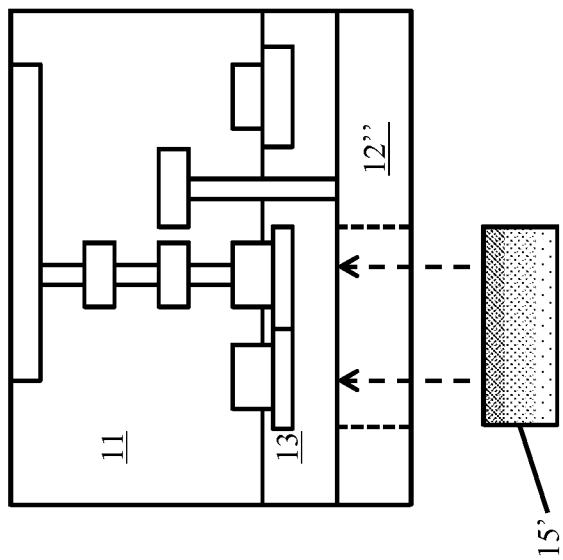
FIG. 12 is an enlarged side view of an SOI wafer with a sectioned fused silica substrate in accordance with further embodiments.
Figure 11:
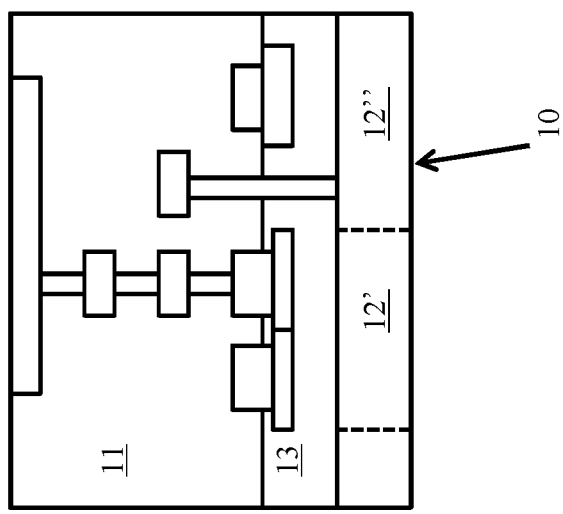
FIG. 11 is an enlarged side view of an SOI wafer in accordance with further embodiments.

In accordance with further embodiments and, with reference to FIGS. 11 and 12, it is to be understood that the thinning and bonding operations described above can be performed with respect to the entirety of the silicon handle 12 (see FIGS. 2-4) or the HIRES SX 16 (see FIGS. 5-7) or to only a portion of these features. For example, as shown in FIGS. 11 and 12, the above-described process optimization may illustrate that only a portion 12' of the silicon handle 12 needs to be removed and replaced by a sectioned alternate material substrate 15' in order to achieve a desired level of improved device performance. As such, the remaining portion 12" of the silicon handle 12 may be left in place so as to avoid over-processing and potentially damaging the wafer 10.

While the portion 12' of the silicon handle 12 and the sectioned alternate material substrate 15' are illustrated as rectangular, it is to be further understood that this is not required and that other, more complex shapes for these features may be provided. Such shapes may include regular or irregular, concave or convex polygonal shapes, shapes with rounded edges or corners or shapes with mixed polygonal and rounded elements. In addition, the alternate material substrate 15 and/or the sectioned alternate material substrate 15' need not be formed of a single alternate material and, in fact, may include multiple materials of varying properties and characteristics. For example, as shown in FIG. 12, the sectioned alternate material substrate 15' may include three different materials of varying resistivity that are arranged to define a resistivity gradient where the resistivity of the sectioned alternate material substrate 15' decreases along a height dimension of the sectioned alternate material substrate 15'.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A foundry-agnostic post-processing method, comprising:
   removing a wafer from an output yield at a foundry, the wafer comprising an intermediate layer with a via between an active surface and a substrate;
   removing other wafers similar to the wafer from output yields of other foundries; and
   compiling the wafer and the other wafers into a wafer set in a post-processing facility,
   wherein, for each wafer and other wafer of the wafer set, the method further comprises:
   thinning the substrate to the intermediate layer at locations remote from the via to expose a new surface;
   avoiding the thinning at a location of the via to form a bump; and
   bonding the new surface to an alternate material substrate while absorbing the bump such that the alternate material substrate is flat at a location corresponding to the location of the via.

2. The foundry-agnostic post-processing method according to claim 1, wherein at least one of the active surface and the substrate comprises at least one of silicon (Si) and silicon germanium (SiGe) and wherein the alternate material substrate comprises a high resistivity material.

3. The foundry-agnostic post-processing method according to claim 1, wherein the alternate material substrate comprises at least one of glass and fused silica.

4. The foundry-agnostic post-processing method according to claim 1, wherein the bonding comprises oxide bonding.

5. The foundry-agnostic post-processing method according to claim 1, wherein the thinning comprises:
   grinding of outer layers of the substrate; and
   chemical mechanical polishing of inner layers of the substrate.

6. The foundry-agnostic post-processing method according to claim 1, wherein the thinning comprises:
   recognizing existence of a via in the wafer; and
   avoiding an execution of the thinning at a location of the via.

7. The foundry-agnostic post-processing method according to claim 1, further comprising:
   obtaining similar wafers from a plurality of foundries;
   executing one or more of the removing, thinning and bonding to each of the similar wafers; and
   optimizing executions of the one or more of the removing, thinning and bonding for each of the similar wafers.

* * * * *